(12) United States Patent
Ogawa et al.

(10) Patent No.: US 11,557,531 B2
(45) Date of Patent: Jan. 17, 2023

(54) SEMICONDUCTOR DEVICE WITH METAL FILM, POWER CONVERSION DEVICE WITH THE SEMICONDUCTOR DEVICE, AND METHOD OF MANUFACTURING THE SEMICONDUCTOR DEVICE

(71) Applicant: Mitsubishi Electric Corporation, Tokyo (JP)

(72) Inventors: Shohei Ogawa, Tokyo (JP); Junji Fujino, Tokyo (JP); Yusuke Ishiyama, Tokyo (JP); Isao Oshima, Tokyo (JP); Takumi Shigemoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 49 days.

(21) Appl. No.: 17/264,945

(22) PCT Filed: Sep. 24, 2019

(86) PCT No.: PCT/JP2019/037368
§ 371 (c)(1),
(2) Date: Feb. 1, 2021

(87) PCT Pub. No.: WO2020/067059
PCT Pub. Date: Apr. 2, 2020

(65) Prior Publication Data
US 2021/0313253 A1  Oct. 7, 2021

(30) Foreign Application Priority Data
Sep. 26, 2018  (JP) .............................. JP2018-180154

(51) Int. Cl.
*H01L 21/50* (2006.01)
*H01L 23/495* (2006.01)
(Continued)

(52) U.S. Cl.
CPC .......... *H01L 23/4952* (2013.01); *H01L 21/50* (2013.01); *H01L 23/49541* (2013.01);
(Continued)

(58) Field of Classification Search
CPC ...... H01L 23/4952; H01L 21/50; H01L 24/14
(Continued)

(56) References Cited

U.S. PATENT DOCUMENTS

2007/0007540 A1* 1/2007 Hashimoto ........... H01L 33/642
257/94
2016/0005703 A1 1/2016 Nakata et al.

FOREIGN PATENT DOCUMENTS

JP 2001332664 A 11/2001
JP 2016111255 A 6/2016
JP 6038280 B2 12/2016

OTHER PUBLICATIONS

International Search Report (PCT/ISA/210) dated Dec. 24, 2019, by the Japan Patent Office as the International Searching Authority for International Application No. PCT/JP2019/037368.
(Continued)

*Primary Examiner* — Quoc D Hoang
(74) *Attorney, Agent, or Firm* — Buchanan Ingersoll & Rooney PC

(57) ABSTRACT

A semiconductor device includes: a substrate; a semiconductor element arranged on the substrate; a plate-like member electrically connected to the semiconductor element; a first electrode formed on the semiconductor element and joined to the plate-like member with solder; a second electrode formed on the semiconductor element and spaced from the first electrode, and including a metal capable of forming an alloy with the solder; and a metal film formed on the semiconductor element and spaced from the second electrode in a region on the first electrode side as seen from
(Continued)

the second electrode, in a two-dimensional view of the semiconductor element as seen from the plate-like member, and including a metal capable of forming an alloy with the solder.

18 Claims, 12 Drawing Sheets

(51) Int. Cl.
  *H01L 23/498*     (2006.01)
  *H01L 23/00*      (2006.01)
  *H01L 21/60*      (2006.01)

(52) U.S. Cl.
  CPC ........ *H01L 23/49816* (2013.01); *H01L 24/14* (2013.01); *H01L 2021/60097* (2013.01); *H01L 2224/73265* (2013.01)

(58) Field of Classification Search
  USPC ........................................................ 257/676
  See application file for complete search history.

(56) References Cited

OTHER PUBLICATIONS

Written Opinion (PCT/ISA/237) dated Dec. 24, 2019, by the Japan Patent Office as the International Searching Authority for International Application No. PCT/JP2019/037368.

* cited by examiner

SEMICONDUCTOR DEVICE WITH METAL FILM, POWER CONVERSION DEVICE WITH THE SEMICONDUCTOR DEVICE, AND METHOD OF MANUFACTURING THE SEMICONDUCTOR DEVICE

TECHNICAL FIELD

The present invention relates to a semiconductor device, a power conversion device, and a method of manufacturing a semiconductor device.

BACKGROUND ART

As a replacement for a structure in which an electrode of a semiconductor element and an external conductor are interconnected by wire bonding using a metal wire such as aluminum, there is known a structure of a semiconductor device in which a plate-like wiring member of metal is soldered to an electrode of a semiconductor element. Such a plate-like wiring structure can allow for passage of large current and increase current density, thereby achieving miniaturization of the semiconductor device (for example, see PTL 1).

As a method of manufacturing a semiconductor device using a plate-like wiring member, there is known a manufacturing method in which solder scattered during a reflow of joining of a lower surface of a semiconductor element to a base plate with solder is prevented from reaching and adhering to an upper surface of the semiconductor element (for example, see PTL 2).

CITATION LIST

Patent Literature

PTL 1: Japanese Patent Laying-Open No. 2001-332664
PTL 2: Japanese Patent Laying-Open No. 2016-111255

SUMMARY OF INVENTION

Technical Problem

Unfortunately, in the structure in which a plate-like wiring member is soldered to an electrode formed on a semiconductor element, solder may be partially scattered and adhere to an electrode to be wired formed on the semiconductor element during the soldering between the electrode formed on the semiconductor element and the plate-like wiring member. Wire bonding with the scattered solder adhering to the electrode to be wired may result in breakage of the semiconductor element.

The present disclosure is made in order to solve the problem as described above, and aims to provide a semiconductor device in which an electrode formed on a semiconductor element and a plate-like member are connected with solder, that can prevent scattered solder from adhering to an electrode to be wired formed on the semiconductor element.

Solution to Problem

A semiconductor device according to the present disclosure includes a substrate, a semiconductor element, a plate-like member, a first electrode, a second electrode, and a metal film. The semiconductor element is arranged on the substrate. The plate-like member is electrically connected to the semiconductor element. The first electrode is formed on the semiconductor element. The first electrode is joined to the plate-like member with solder. The second electrode is formed on the semiconductor element and spaced from the first electrode. The second electrode includes a metal capable of forming an alloy with the solder. The metal film is formed on the semiconductor element and spaced from the second electrode in a region on the first electrode side as seen from the second electrode, in a two-dimensional view of the semiconductor element as seen from the plate-like member. The metal film includes a metal capable of forming an alloy with the solder.

A semiconductor device according to the present disclosure includes: a substrate; a semiconductor element arranged on the substrate; a plate-like member electrically connected to the semiconductor element; a first electrode formed on the semiconductor element and joined to the plate-like member with solder; a second electrode to be wired formed on the semiconductor element and spaced from the first electrode, and including a metal capable of forming an alloy with the solder; and a metal film formed between and spaced from the first electrode and the second electrode on the semiconductor element, including a metal capable of forming an alloy with the solder, and being different from the first electrode and the second electrode.

Advantageous Effects of Invention

In the semiconductor device according to the present disclosure, since the metal film including a metal capable of forming an alloy with the solder is formed between the first electrode to which the plate-like member electrically connected to the semiconductor element is joined with solder and the second electrode to be wired, scattered solder can be prevented from adhering to the second electrode to be wired, so that breakage of the semiconductor element, which may occur by wire bonding with the scattered solder adhering to the second electrode, can be prevented.

DESCRIPTION OF EMBODIMENTS

Embodiments of the present invention are described below. The same elements are designated by the same reference numbers and a description thereof will not be repeated.

First Embodiment

Figure 1:
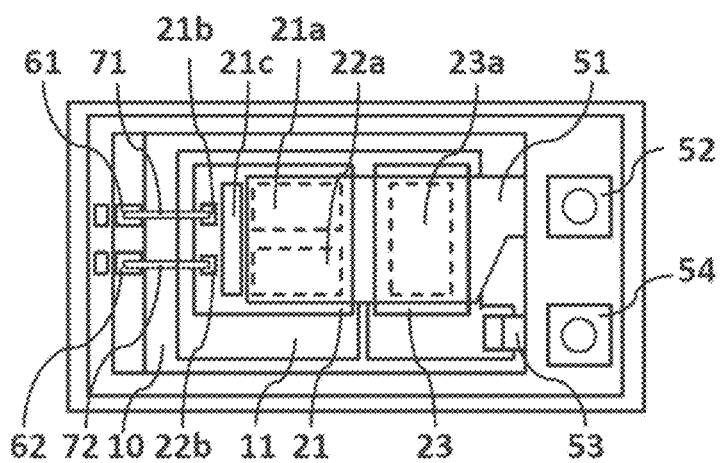
FIG. 1 is a plan view showing a semiconductor device according to a first embodiment of the present invention.
Figure 2:
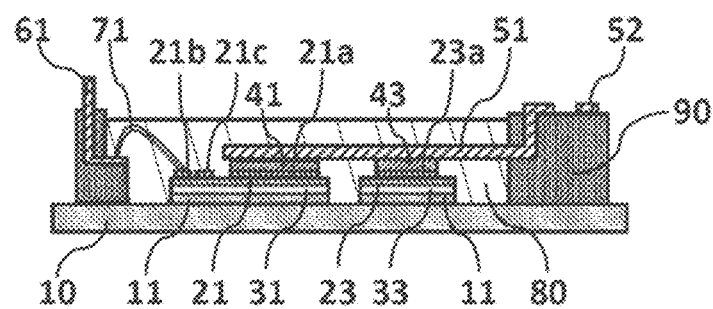
FIG. 2 is a cross-sectional view showing the semiconductor device according to the first embodiment of the present invention.

The configuration of a semiconductor device according to a first embodiment of the present invention is described. FIG. 1 is a plan view showing the semiconductor device according to the first embodiment of the present invention. FIG. 2 is a cross-sectional view showing the semiconductor device according to the first embodiment of the present invention. Portions covered with a sealing resin and a lead frame (plate-like member) are not actually visible in FIG. 1, but are shown through the sealing resin and the lead frame for illustrative purposes.

In FIGS. 1 and 2, the semiconductor device mainly includes: an insulating substrate 10 as a substrate; semiconductor elements 21, 23 arranged on insulating substrate 10; a first lead frame (plate-like member) 51 electrically connected to a main electrode (first electrode) 21a, a main electrode (first electrode) 22a of semiconductor element 21, and a main electrode 23a of semiconductor element 23, and through which main circuit current flows; a second lead frame 61 electrically connected through a wire 71 to a control electrode (second electrode) 21b for control of semiconductor element 21 and receiving a control signal for controlling semiconductor element 21; a sealing resin portion 80 covering semiconductor elements 21, 23 and the peripheral members around semiconductor elements 21, 23; and a case 90 accommodating these components.

Insulating substrate 10 is formed with an insulator substrate such as a ceramic substrate with high thermal conductivity, such as aluminum nitride (AlN), and, for example, has outer dimensions of 40 mm×25 mm and a thickness of 0.6 mm.

Insulating substrate 10 is not limited to aluminum nitride and may be any substrate that provides insulating properties, for example, a ceramic substrate such as alumina ($Al_2O_3$) or silicon nitride ($Si_3N_4$). The substrate may be a substrate other than ceramics, such as a glass epoxy substrate and a metal base substrate.

The front surface of insulating substrate 10 is provided with a conductor layer 11 formed of a metal with high electrical conductivity, such as aluminum (Al) or aluminum alloy. The back surface of insulating substrate 10 may be provided with a conductor layer (not shown) formed of a metal with high electrical conductivity, such as aluminum (Al) or aluminum alloy. Conductor layer 11 is formed of, for example, aluminum with a thickness of 0.3 mm. Conductor layer 11 on the front surface side and the conductor layer on the back surface side may be formed of different materials but preferably formed of the same material for reducing manufacturing costs. Conductor layer 11 formed on insulating substrate 10 is not limited to aluminum, and may be formed of copper (Cu) or copper alloy.

When joining conductor layer 11 to semiconductor elements 21, 23 with solder, the solder does not wet if conductor layer 11 is formed of aluminum. Thus, nickel (Ni) (not shown) that is a solder-wettable metal material may be formed on a surface of the aluminum to a thickness of 5.0 µm, for example. With the solder-wettable metal material formed in this manner, conductor layer 11 and semiconductor elements 21, 23 are joined with solders 31, 33 as a bonding material. The solder-wettable metal material may be tin (Sn), gold (Au), silver (Ag) and the like, rather than nickel.

Conductor layer 11 has a circuit pattern for allowing main circuit current to flow through semiconductor elements 21, 23. Since semiconductor elements 21, 23 are joined to conductor layer 11 by the bonding material such as solders 31, 33, conductor layer 11 is preferably a metal with high electrical conductivity. When forming the conductor layer (not shown) on the back side of insulating substrate 10, a heatsink (not shown) for dissipating heat generated in semiconductor elements 21, 23 to the outside of the semiconductor device may be joined to the conductor layer on the back side by a bonding material such as solder. Thus, the conductor layer on the back side is also preferably a metal with high thermal conductivity.

Semiconductor element 21 and semiconductor element 23 are power semiconductor switching elements or control ICs (Integrated Circuits) such as diodes, IGBTs (Insulated Gate Bipolar Transistors), and MOSFETs (Metal-Oxide-Semiconductor Field-Effect Transistors). Alternatively, they may be rectifying elements such as SBDs (Schottky Barrier Diodes), JBS (Junction Barrier Schottky), and thyristors.

In the present disclosure, semiconductor element 21 is an IGBT formed of silicon (Si), and semiconductor element 23 is a diode formed of silicon. For example, semiconductor element 21 has outer dimensions of 15 mm×15 mm and a thickness of 100 µm. Semiconductor element 23 has outer dimensions of 10 mm×15 mm and a thickness of 100 µm. Semiconductor elements 21, 23 may be formed of a semiconductor material such as silicon carbide (SiC) and gallium nitride (GaN).

As shown in FIGS. 1 and 2, in the present disclosure, the semiconductor device is a semiconductor device of 1-in-1 configuration including a pair of semiconductor element 21 that is an IGBT and semiconductor element 23 that is a diode. However, the semiconductor device may be a semiconductor device of 2-in-1 configuration including two pairs of IGBT and diode or a semiconductor device of 6-in-1 configuration including six pairs. The semiconductor device may include only semiconductor element 21. The semiconductor device may include a semiconductor switching element such as MOSFET in place of IGBT.

Semiconductor element 21 that is an IGBT and semiconductor element 23 that is a diode each have a back electrode (not shown) joined to insulating substrate 10 with conductor layer 11 interposed and a front electrode provided on a surface opposite to the back electrode.

A spacer formed of an aluminum wire (not shown) with a wire diameter of 100 µm is mounted at each of four corners of a position on conductor layer 11 where each of semiconductor elements 21, 23 is to be joined, to join conductor layer 11 to semiconductor elements 21, 23 with solders 31, 33. For solders 31, 33, Sn/Ag/Cu-based solder mainly composed of tin, silver and copper is used. Solder 31 has outer dimensions of 15 mm×15 mm, solder 33 has outer dimensions of 15 mm×10 mm, and solders 31, 33 have a thickness of 100 to 200 µm after the joining.

Alternatively, the solder material may be Sn/Ag-based solder mainly composed of tin and silver, Sn/Cu-based solder mainly composed of tin and copper, Sn/Bi-based solder mainly composed of tin and bismuth (Bi), and the like. Solders 31, 33 may include antimony (Sb), nickel, indium (In), bismuth, aluminum, zinc (Zn) and the like. Although the material of solders 31, 33 including lead (Pb) achieves the effect of the present disclosure, solder including lead is not environmentally friendly and thus not preferable.

The bonding material for joining conductor layer 11 to semiconductor elements 21, 23 is not limited to solders 31, 33, and a sintered material such as silver nanoparticles and copper nanoparticles may be used.

The spacer may be a Cu wire rather than an Al wire. The diameter of the wire as the spacer is not limited to 100 µm as long as it is smaller than the thickness of the solders in the joined state. Since only a minimum solder thickness should be secured by the spacer, a nickel ball may be used as the spacer. The soldering may be performed without the spacer.

On semiconductor element 21, that is, on the front surface of semiconductor element 21, main electrodes 21a, 22a are formed as front electrodes and joined to first lead frame 51 with solder 41. Main circuit current flows between main electrodes 21a, 22a of semiconductor element 21 and the back electrode (not shown) of semiconductor element 21. On semiconductor element 23, that is, on the front surface of semiconductor element 23, main electrode 23a is formed as a front electrode and joined to first lead frame 51 with solder 43. Main circuit current flows between main electrode 23a that is the front electrode of semiconductor element 23 and the back electrode (not shown) of semiconductor element 23.

Main electrodes 21a, 22a, 23a include nickel capable of soldering. A metal capable of soldering, that is, a metal capable of forming an alloy with the solder, may be gold, silver and copper, rather than nickel, and main electrodes 21a, 22a, 23a may include at least one of nickel, gold, silver and copper.

Main electrodes 21a, 22a are electrodes to which first lead frame 51 is joined with solder and through which large main circuit current flows, and each have an area larger than control electrode 21b and a temperature sensing electrode 22b which will be described later.

As shown in FIG. 1, on semiconductor element 21, control electrode 21b for a control signal and temperature sensing electrode (second electrode) 22b for measuring temperature of the semiconductor element are formed and spaced from main electrodes 21a and 22a, respectively. In other words, main electrode 21a and control electrode 21b are spaced from each other, and main electrode 21a and temperature sensing electrode 22b are spaced from each other, on semiconductor element 21. Main electrode 22a and control electrode 21b are spaced from each other, and main electrode 22a and temperature sensing electrode 22b are spaced from each other, on the front surface of semiconductor element 21.

In this example, two main electrode 21a and main electrode 22a are provided as the main electrodes on semiconductor element 21. When main electrode 21a and main electrode 22a are connected into a single main electrode, the single main electrode and control electrode 21b are spaced from each other, and the single main electrode and temperature sensing electrode 22b are spaced from each other.

Control electrode 21b and second lead frame 61 are electrically connected through wire 71, and control conduction and cut-off of main circuit current based on an input control signal. Temperature sensing electrode 22b and a second lead frame 62 are electrically connected through a wire 72.

Wires 71, 72 may be, for example, aluminum wires, copper wires coated with aluminum, or gold wires with a diameter of 0.15 mm. Wire 71 is ultrasonic-welded to second lead frame 61 and control electrode 21b by wire bonding. Wire 72 is ultrasonic-welded to second lead frame 62 and temperature sensing electrode 22b by wire bonding.

The front surface of semiconductor element 21 may be provided with, other than control electrode 21b and temperature sensing electrode 22b, an emitter current sensing electrode for measuring emitter current. When provided, the emitter current sensing electrode is electrically connected through a wire in a manner similar to control electrode 21b and the like. In the present disclosure, of the electrodes on the front surface of semiconductor element 21, electrodes to be wired such as control electrode 21b, temperature sensing electrode 22b, and the emitter current sensing electrode will be collectively referred to as second electrodes. As shown in FIG. 1, the electrodes to be wired are preferably arranged in a row along one side of semiconductor element 21 for facilitating the ultrasonic welding.

On semiconductor element 21, a metal film 21c including nickel as a metal capable of forming an alloy with the solder is formed between main electrodes 21a, 22a and control electrode 21b, temperature sensing electrode 22b, and spaced from each of main electrodes 21a, 22a and control electrode 21b, temperature sensing electrode 22b. The metal capable of forming an alloy with the solder can also be described as a metal having solder wettability.

Main electrode 21a, main electrode 22a joined to first lead frame 51 with solder 41 on semiconductor element 21 correspond to first electrodes in the present application. When there are a plurality of electrodes joined to first lead frame 51 with solder 41 on semiconductor element 21 in this manner, the electrodes joined to first lead frame 51 will be collectively referred to as first electrodes.

In a step of solder-joining first lead frame 51 to main electrodes 21a, 22a, solder 41 takes in air while it melts. Even when they are joined in a vacuum, solder 41 takes in a small amount of remaining air. When the introduced air comes out, the solder may be partially scattered and move over semiconductor element 21. In the present disclosure, the solder scattered when the air introduced into the solder comes out during the melting of solder 41 in the solder-joining step will be referred to as solder balls.

Once metal film 21c including a metal capable of forming an alloy with the solder is formed, the solder balls released from solder 41 come into contact with metal film 21c, and when cooled through the solder-joining step, at least part of metal film 21c and the solder balls that have come into contact with metal film 21c are alloyed. In other words, at least part of metal film 21c and the solder balls that have come into contact with metal film 21c are joined.

Metal film 21c should only include a metal capable of forming an alloy with the solder, and may include at least one of nickel (Ni), gold (Au), silver (Ag), and copper (Cu). When at least one of nickel, gold, silver and copper is exposed through at least part of the topmost surface of metal film 21c, the part of the topmost surface of metal film 21c and the solder balls come into contact with each other and are alloyed in the solder-joining step, thus allowing the adherence of the solder balls. A film including at least one of nickel, gold, silver and copper is preferably formed on the topmost surface of metal film 21c for more effectively achieving the adherence of the solder balls.

Metal film 21c is a film for solder balls to adhere to. In other words, unlike main electrodes 21a, 22a, metal film 21c is not a film that is joined to first lead frame 51 with solder. Unlike the electrodes to be wired such as control electrode 21b and temperature sensing electrode 22b, metal film 21c is not a film that is wired.

When there are a plurality of first electrodes joined to first lead frame 51 with solder 41, metal film 21c is formed at least between a first electrode closest to the second electrode and the second electrode. In the example of FIG. 1, two main electrodes 21a, 22a as the first electrodes are aligned in a direction perpendicular to the direction in which first lead frame 51 extends. When there are a plurality of main electrodes in the direction in which first lead frame 51 extends, for example, metal film 21c is formed at least between a main electrode closest to control electrode 21b and temperature sensing electrode 22b, and control electrode 21b and temperature sensing electrode 22b.

Although main electrodes 21a, 22a and metal film 21c are formed on the front surface of semiconductor element 21 in the example shown in FIGS. 1 and 2, a third electrode 24 may be further provided on the front surface of semiconductor element 21, and main electrodes 21a, 22a and metal film 21c may be formed on third electrode 24, as will be described later. In other words, third electrode 24 may be formed between the front surface of semiconductor element 21 and main electrodes 21a, 22a, and between the front surface of semiconductor element 21 and metal film 21c. In this case, third electrode 24 having a larger area than main electrodes 21a, 22a can be provided to spread current to a larger area of semiconductor element 21. Third electrode 24 may include at least one of nickel, gold, silver and copper, which are metals capable of forming an alloy with the solder, or may include at least one of aluminum, aluminum silicon (AlSi) and titanium (Ti), which are metals not forming an alloy with the solder.

Although control electrode 21b, temperature sensing electrode 22b are formed on the front surface of semiconductor element 21 in the example shown in FIGS. 1 and 2, a fourth electrode 25 spaced from third electrode 24 may be further provided on the front surface of semiconductor element 21, and control electrode 21b and temperature sensing electrode 22b may be formed on fourth electrode 25, as will be described later. Similar to third electrode 24, fourth electrode 25 may include at least one of nickel, gold, silver and copper, which are metals capable of forming an alloy with the solder, or may include at least one of aluminum, aluminum silicon (AlSi) and titanium (Ti), which are metals not forming an alloy with the solder.

Figure 3A:
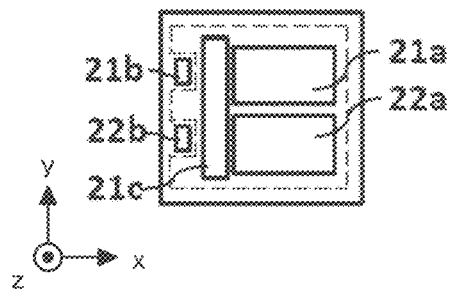
FIG. 3A is an enlarged plan view of a semiconductor element according to the first embodiment of the present invention.
Figure 3B:
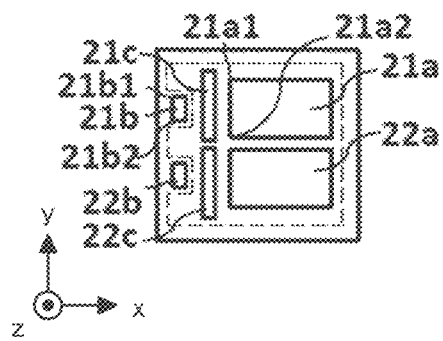
FIG. 3B is an enlarged plan view of the semiconductor element according to the first embodiment of the present invention.
Figure 3C:
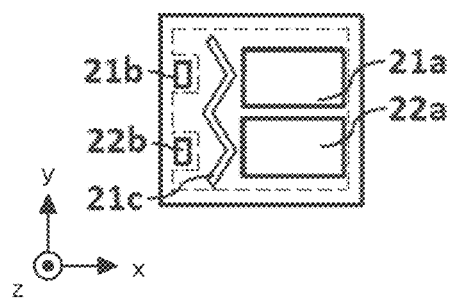
FIG. 3C is an enlarged plan view of the semiconductor element according to the first embodiment of the present invention.
Figure 3D:
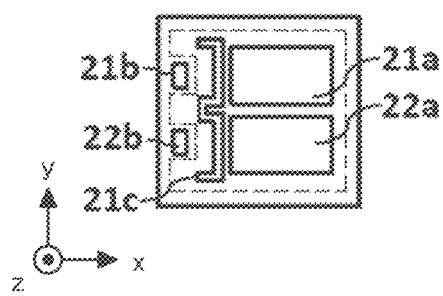
FIG. 3D is an enlarged plan view of the semiconductor element according to the first embodiment of the present invention.
Figure 3E:
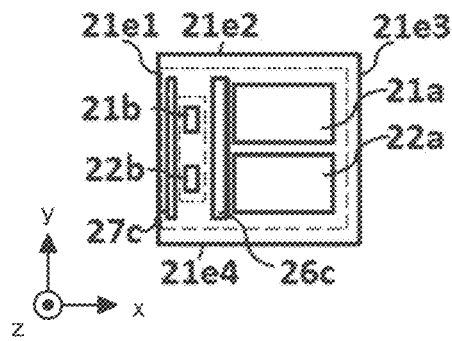
FIG. 3E is an enlarged plan view of the semiconductor element according to the first embodiment of the present invention.
Figure 3F:
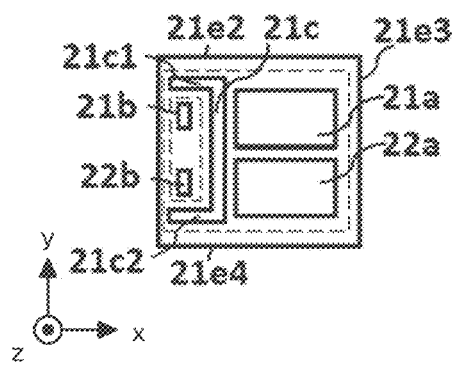
FIG. 3F is an enlarged plan view of the semiconductor element according to the first embodiment of the present invention.

FIGS. 3A to 3L are enlarged plan views of the semiconductor element according to the first embodiment of the present invention. In the figures, x, y and z orthogonal coordinate axes are also shown for illustrating directions. Main electrode 21a and control electrode 21b are arranged to be spaced from each other in the x axis direction, and main electrode 22a and temperature sensing electrode 22b are arranged to be spaced from each other in the x axis direction. Main electrode 21a and main electrode 22a are aligned in the y axis direction, and control electrode 21b and temperature sensing electrode 22b are similarly aligned in the y axis direction. The broken lines in FIGS. 3A to 3L indicate the outer periphery and the inner periphery of third electrode 24 when third electrode 24 is provided. Outer peripheral portions 21e1 to 21e4 of semiconductor element 21 are shown in FIGS. 3E and 3F.

Metal film 21c is, for example, as shown in FIG. 3A, formed between main electrodes 21a, 22a and control electrode 21b, temperature sensing electrode 22b, along main electrodes 21a, 22a, and along control electrode 21b and temperature sensing electrode 22b. That is, metal film 21c is linearly formed between main electrodes 21a, 22a as the front electrodes and control electrode 21b, temperature sensing electrode 22b.

Metal film 21c may have any of the shapes shown in FIGS. 3B to 3L that allows solder balls which may be generated from solder 41 to adhere to metal film 21c to prevent the solder balls from adhering to the electrodes to be wired such as control electrode 21b.

As shown in FIG. 3B, the metal film may be provided as two separate metal film 21c and metal film 22c between main electrode 21a and control electrode 21b, and between main electrode 22a and temperature sensing electrode 22b, respectively. For example, metal film 21c may be provided as a single continuous film at a position overlapping an area located between a straight line connecting a corner 21a1 of main electrode 21a to a corner 21b1 of control electrode 21b, and a straight line connecting a corner 21a2 of main electrode 21a to a corner 21b2 of control electrode 21b. That is, metal film 21c may be provided as a single continuous film intersecting both the straight line connecting corner 21a1 of main electrode 21a to corner 21b1 of control electrode 21b, and the straight line connecting corner 21a2 of main electrode 21a to corner 21b2 of control electrode 21b, in they axis direction. Metal film 22c may be provided between main electrode 22a and temperature sensing electrode 22b in the same manner as metal film 21c.

The shape of metal film 21c is not limited to a rectangular shape such as an oblong shape shown in FIGS. 3A and 3B, and may be such that the shortest distance between main electrode 21a and metal film 21c in the x axis direction and the shortest distance between control electrode 21b and metal film 21c in the x axis direction vary in they axis direction in which main electrodes 21a, 22a are aligned, as shown in FIGS. 3C and 3D. Metal film 21c shown in FIG. 3C is shaped as a strip with bends or zig-zag shaped in a two-dimensional view. Metal film 21c shown in FIG. 3D has a shape formed of two U-shapes protruding toward main electrodes 21a, 22a and connected at their respective ends in a two-dimensional view.

As shown in FIGS. 3E and 3F, the metal film may be provided not only between main electrode 21a and control electrode 21b but also at positions to sandwich control electrode 21b in two directions. Specifically, as shown in FIG. 3E, the metal film may have a first metal film 26c formed between main electrodes 21a, 22a and control electrode 21b, temperature sensing electrode 22b, and a second metal film 27c formed opposite first metal film 26c with respect to control electrode 21b, temperature sensing electrode 22b. In this configuration, control electrode 21b is sandwiched between first metal film 26c and second metal film 27c. Stated another way, second metal film 27c is provided between control electrode 21b and outer peripheral portion 21e1 of the semiconductor element closest to control electrode 21b.

As shown in FIG. 3F, metal film 21c extending in they axis direction has, at its opposite ends, a first end portion 21c1 extending toward control electrode 21b, and a second end portion 21c2 extending toward temperature sensing electrode 22b. Control electrode 21b and temperature sensing electrode 22b are sandwiched between first end portion 21c1 and second end portion 21c2. Stated another way, one end of metal film 21c extending in they axis direction has first end portion 21c1 extending in the x axis direction to a portion between control electrode 21b and outer peripheral portion 21e2 of semiconductor element 21 second closest to control electrode 21b. The other end of metal film 21c has second end portion 21c2 extending in the x axis direction to a portion between temperature sensing electrode 22b and outer peripheral portion 21e4 of semiconductor element 21 second closest to temperature sensing electrode 22b.

In this manner, first end portion 21c1 and second end portion 21c2 may be provided, rather than between control electrode 21b and temperature sensing electrode 22b, between control electrode 21b and outer peripheral portion 21e2 of semiconductor element 21, and between temperature sensing electrode 22b and outer peripheral portion 21e4 of semiconductor element 21. In this configuration, control electrode 21b and temperature sensing electrode 22b that are electrodes to be wired are surrounded in three directions. Although metal film 21c, first end portion 21c1 and second end portion 21c2 are illustrated as a continuous film in this example, they may be provided as three separate sections.

Figure 3G:
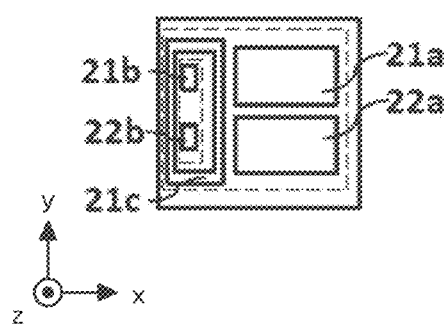
FIG. 3G is an enlarged plan view of the semiconductor element according to the first embodiment of the present invention.

As shown in FIG. 3G, metal film 21c can have a shape surrounding control electrode 21b and temperature sensing electrode 22b that are electrodes to be wired. Although both control electrode 21b and temperature sensing electrode 22b are surrounded in this example, control electrode 21b and temperature sensing electrode 22b may be individually surrounded with the metal film.

Figure 3H:
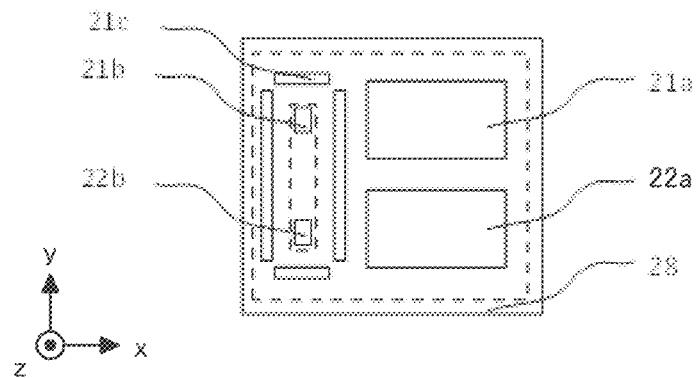
FIG. 3H is an enlarged plan view of the semiconductor element according to the first embodiment of the present invention.

As shown in FIG. 3H, metal film 21c may have a shape surrounding control electrode 21b and temperature sensing electrode 22b that are electrodes to be wired, with cut-away four corners. That is, metal film 21c includes a plurality of metal film portions arranged to surround control electrode 21b and temperature sensing electrode 22b that are the second electrodes. Cutting of a protective film 28 which will be described later can thus be prevented. As a result, separation of protective film 28 can be prevented.

Figure 3I:
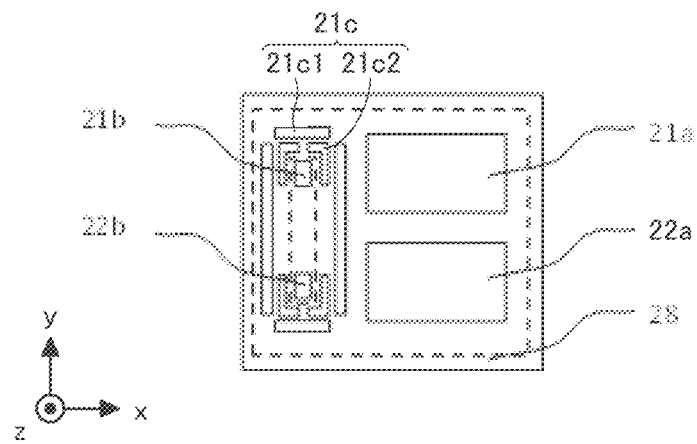
FIG. 3I is an enlarged plan view of the semiconductor element according to the first embodiment of the present invention.

As shown in FIG. 3I, metal film 21c may be doubly arranged in an L-shape at each of four corners. That is, metal film 21c may include a plurality of metal film portions 21c1 (outer peripheral metal film portions) arranged to surround control electrode 21b and temperature sensing electrode 22b that are the second electrodes, and inner peripheral metal film portions 21c2 arranged between metal film portions 21c1 and control electrode 21b, temperature sensing electrode 22b. Separation of protective film 28 can thus be prevented while the anti-solder-scattering function is maintained.

Figure 3J:
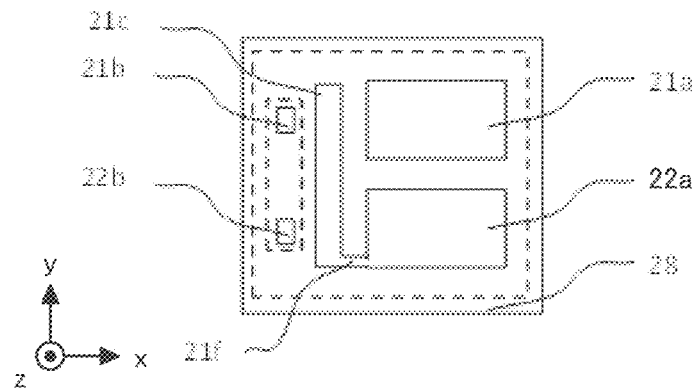
FIG. 3J is an enlarged plan view of the semiconductor element according to the first embodiment of the present invention.

As shown in FIG. 3J, main electrode 22a and metal film 21c may be connected in a superficial manner through an exposed portion 21f as a connecting portion having a smaller width than the short side width of metal film 21c. That is, the semiconductor device may include exposed portion 21f as a connecting portion to connect metal film 21c and main electrode 22a. The minimum width of exposed portion 21f may be smaller than the minimum width of main electrode 22a. The anti-solder-scattering function is thus not affected. When exposed portion 21f is too wide, solder supplied to main electrode 22a may wet and spread, thus causing solder scattering.

Figure 3K:
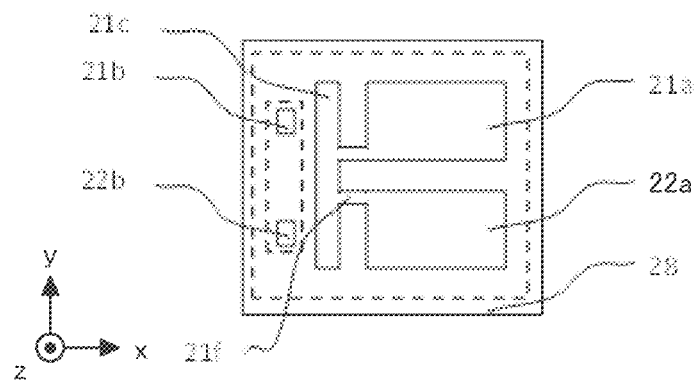
FIG. 3K is an enlarged plan view of the semiconductor element according to the first embodiment of the present invention.

The anti-solder-scattering function is not affected when main electrodes 21a, 22a and metal film 21c are connected in a superficial manner through a plurality of exposed portions 21f as connecting portions near the center of semiconductor element 21, as shown in FIG. 3K. The minimum width of exposed portion(s) 21f as a connecting portion(s) shown in FIGS. 3J and 3K may be smaller than the minimum width of metal film 21c.

When main electrodes 21a, 22a and metal film 21c are connected through exposed portion(s) 21f as a connecting portion(s) as shown in FIGS. 3J, 3K and the like, metal film 21c may be arranged at a position not overlapping first lead frame 51 in a two-dimensional view of semiconductor element 21 as seen from first lead frame 51 as a plate-like member as shown in FIG. 1. From a different viewpoint, the connection portion of metal film 21c connected to exposed portion 21f may be arranged at a position not overlapping first lead frame 51 in the two-dimensional view. Alternatively, metal film 21c may be arranged to partially overlap first lead frame 51 in the two-dimensional view. In other words, in the two-dimensional view, metal film 21c may at least partially be located on the control electrode 21b side with respect to an end surface of first lead frame 51 on the control electrode 21b side. From a different viewpoint, in the two-dimensional view, an end surface of metal film 21c on the control electrode 21b side may be located between the end surface of first lead frame 51 on the control electrode 21b side and control electrode 21b. Main electrodes 21a, 22a, on the other hand, may be arranged at positions overlapping first lead frame 51 in the two-dimensional view. Main electrodes 21a, 22a may be arranged only at positions overlapping first lead frame 51 in the two-dimensional view.

Figure 3L:
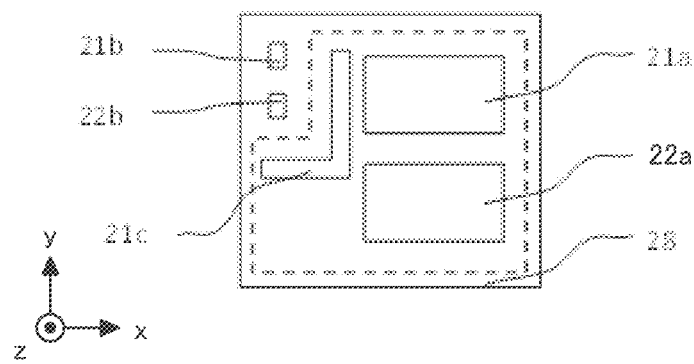
FIG. 3L is an enlarged plan view of the semiconductor element according to the first embodiment of the present invention.

When control electrode 21b and temperature sensing electrode 22b that are electrodes to be wired are arranged at a corner of semiconductor element 21 as shown in FIG. 3L, similar effects can be achieved by arranging metal film 21c in an L-shape at the corner.

Although metal film 21c is a continuous film in FIGS. 3A to 3L, metal film 21c in FIG. 3A may be divided into a plurality of sections in the y axis direction and the x axis direction to the extent that allows the adherence of solder balls. The configurations in FIGS. 3A to 3L may be combined.

Main electrode 21a joined to first lead frame 51 and control electrode 21b need to be spaced apart more than 1.0 mm, for example. This is to prevent interference in which equipment, such as a joint device head for use in the ultrasonic welding of wire 71 to second lead frame 61 and control electrode 21b, hits first lead frame 51.

For example, metal film 21c shown in FIG. 3A has a width of 0.8 mm in the x axis direction, and a length of 10 mm in the y axis direction. When the width is 0.8 mm in this manner, metal film 21c can be provided in a spacing of 1.0 mm that prevents the interference of the equipment, and spaced from each of main electrodes 21a, 22a and control electrode 21b, temperature sensing electrode 22b. In other words, metal film 21c can be formed without an increase in size of the semiconductor element.

When semiconductor element 21 is a power semiconductor element, a terminal structure is formed at a peripheral portion of the power semiconductor element, and metal film 21c cannot be formed directly on the terminal structure. From the viewpoint of achieving miniaturization of the semiconductor element, metal film 21c may be formed in a region, which is shown in FIG. 3B, on the control electrode 21b side with respect to a line connecting corner 21a1 and corner 21a2 of main electrode 21a and extended in they axis direction, and on the main electrode 21a side with respect to a line connecting corner 21b1 and corner 21b2 of control electrode 21b and extended in they axis direction. As shown in FIGS. 3A to 3D, metal film 21c is more preferably formed only between the region in which main electrodes 21a, 22a are formed and the region in which control electrode 21b, temperature sensing electrode 22b are formed.

Metal film 21c needs to prevent solder balls that may be released from solder 41 of main electrodes 21a, 22a from adhering to control electrode 21b and temperature sensing electrode 22b that are electrodes to be wired, and metal film 21c may be longer than control electrode 21b or temperature sensing electrode 22b in the y axis direction. A longer length in the x axis direction leads to a larger area for the adherence of the solder balls. Thus, metal film 21c may have an area larger than control electrode 21b or temperature sensing electrode 22b.

Metal film 21c does not need to have a large area as long as it can perform the function of allowing the solder balls to adhere thereto. For example, the area may be between 3% or more and 20% or less with respect to a total value of the areas of main electrode 21a and main electrode 22a. When third electrode 24 is provided, the area may be between 3% or more and 20% or less with respect to the area of third electrode 24 encircled by the broken lines in FIGS. 3A to 3L.

Figure 4:
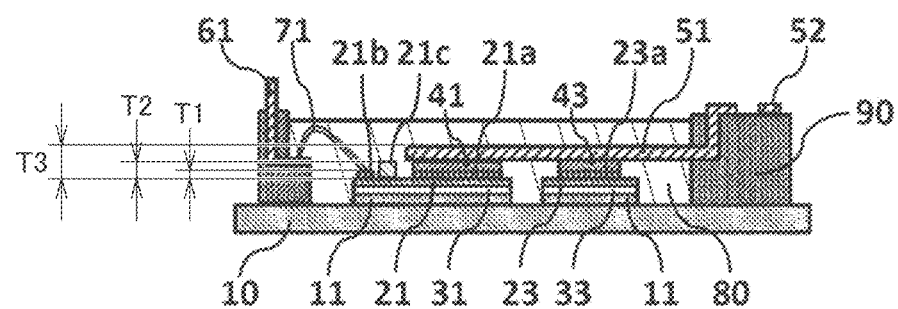
FIG. 4 is a cross-sectional view showing a variation of the semiconductor device according to the first embodiment of the present invention.

FIG. 4 is a cross-sectional view showing a variation of the semiconductor device according to the first embodiment of the present invention. The semiconductor device shown in FIG. 4 basically has a similar configuration to the semiconductor device shown in FIGS. 1 and 2, but differs from the semiconductor device shown in FIGS. 1 and 2 in the configuration of metal film 21c. That is, a height T2 of metal film 21c in the semiconductor device shown in FIG. 4 may be higher than the height of main electrodes 21a, 22a on which solder 41 is applied, with reference to the front surface of semiconductor element 21. Similarly, height T2 of metal film 21c may be higher than a height T1 of control electrode 21b and temperature sensing electrode 22b as the second electrodes to be wired. This configuration can prevent the solder balls from adhering to control electrode 21b and temperature sensing electrode 22b. Height T2 of metal film 21c may be equal to the height of solder 41. In other words, with reference to the front surface of semiconductor element 21, height T2 of metal film 21c may be higher than the height of main electrodes 21a, 22a on which solder 41 is applied, and lower than a height T3 of first lead frame 51. This configuration can prevent the solder balls from jumping over metal film 21c and reaching control electrode 21b or temperature sensing electrode 22b. When only height T2 of metal film 21c is increased in this manner, for example, a film may be formed only on metal film 21c, to increase the height.

First lead frame 51 as a plate-like wiring member shown in FIGS. 1 and 2 is formed, for example, of copper or copper alloy with a thickness of 1.0 mm, and joined to main electrodes 21a, 22a formed on semiconductor element 2 with solder 41. First lead frame 51 is joined to main electrode 23a formed on semiconductor element 23 with solder 43.

First lead frame 51 may be formed of aluminum or aluminum alloy not wettable by solder, with a solder-wettable metal material such as copper or copper alloy formed on the solder joint portion, or with a metal such as nickel and gold formed on a surface of the solder joint portion. A clad material including a plurality of bonded metals such as Invar may be used for first lead frame 51.

Although the plate-like member is the first lead frame that is a plate-like wiring member in this example, the plate-like member may be, for example, a printed board having a wiring pattern.

For solders 41, 43, Sn/Ag/Cu-based solder mainly composed of tin, silver and copper may be used. For example, solder 41 provided on each of main electrode 21a and main electrode 22a may have a long side length of 6 to 9 mm and a short side length of 4 to 5 mm as outer dimensions. Solder 43 may have a long side length of 9 to 12 mm and a short side length of 6 to 8 mm as outer dimensions. Solders 41, 43 after the joining have a thickness of 300 to 500 µm, for example.

Similar to solders 31, 33 described above, Sn/Cu-based solder mainly composed of tin and copper, or Sn/Ag-based solder mainly composed of tin and silver may be used for solders 41, 43.

As shown in FIG. 1, a terminal plate 53 formed of a metal with high electrical conductivity such as copper and copper alloy is joined to conductor layer 11 by ultrasonic bonding or other methods. Terminal plate 53 has a main terminal 54 to be fixed to case 90. The back electrodes of semiconductor elements 21, 23 are thus electrically connected to main terminal 54.

First lead frame 51 has a main terminal 52 for use in electrical connection to external equipment at an end portion on the opposite side to the side joined to semiconductor elements 21, 23, and main terminal 52 is fixed to case 90.

Main terminal 52 and main terminal 54 are electrically connected through conductor layer 11, semiconductor elements 21, 23, and first lead frame 51 to allow main circuit current to flow between main terminal 52 and main terminal 54.

Second lead frames 61, 62 are formed of copper or copper alloy or aluminum or aluminum alloy and are fixed to case 90. One end of each of second lead frames 61, 62 is exposed on the outside of the semiconductor device, and second lead frame 61 serves as a control terminal for input of a control signal. Second lead frame 62 serves as a terminal for measuring temperature of the semiconductor element.

When second lead frames 61, 62 are formed of aluminum or aluminum alloy, the portion of the control terminal exposed on the outside of the semiconductor device may be plated with copper or nickel to improve solder wettability.

The other end of second lead frame 61 is electrically connected to control electrode 21b provided on the front surface of semiconductor element 21 through wire 71. Similarly, the other end of second lead frame 62 is electrically connected to temperature sensing electrode 22b provided on the front surface of semiconductor element 21 through wire 72.

Although first lead frame 51 as a plate-like wiring member and second lead frames 61, 62 are embedded in and fixed to case 90 in the example of FIG. 2, the end portion of first lead frame 51 on the opposite side to the side joined to semiconductor elements 21, 23, or the end portion of second lead frame 61 on the opposite side to the side joined to wire 71 may be connected to an electrode terminal formed in the case beforehand with solder or a conductive adhesive.

Case 90 is formed in a frame shape of PPS (Poly Phenylene Sulfide) resin, surrounds the outer periphery of the surface of insulating substrate 10 on which semiconductor elements 21, 23 are mounted, and is bonded to insulating substrate 10.

Case 90 may be PBT (Poly Butylene Terephthalate) and the like, as long as it is not thermally deformed during heating and melting of solders 41, 43.

Sealing resin portion 80 is formed of epoxy-based resin and covers conductor layer 11, semiconductor elements 21, 23, part of first lead frame 51, part of second lead frame 61, wires 71, 72, and solders 31, 33, 41, 43 to provide insulation sealing. The sealing resin that forms sealing resin portion 80 is not limited to epoxy-based resin and may be any material that provides insulation, for example, liquid gel.

The sealing method using a resin material may be a sealing method by transfer molding, rather than the sealing method using case 90 and sealing resin portion 80 described above.

A method of manufacturing the front electrodes and the metal film of the semiconductor element will now be described.

Figure 5:
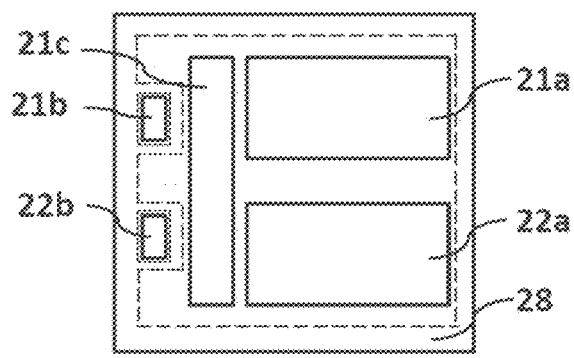
FIG. 5 is an enlarged plan view of the semiconductor element having a protective film according to the first embodiment of the present invention.

FIG. 5 is an enlarged plan view of the semiconductor element having the protective film according to the first embodiment of the present invention. FIGS. 6A to 6C and FIGS. 7A to 7C are cross-sectional views showing manufacturing methods of forming the protective film, the electrodes and the metal film on the semiconductor element according to the first embodiment of the present invention.

Figure 6A:
FIG. 6A is a cross-sectional view showing a manufacturing method of forming the protective film, electrodes and a metal film on the semiconductor element according to the first embodiment of the present invention.
Figure 6B:
FIG. 6B is a cross-sectional view showing the manufacturing method of forming the protective film, the electrodes and the metal film on the semiconductor element according to the first embodiment of the present invention.
Figure 6C:
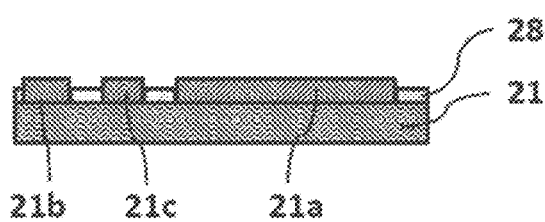
FIG. 6C is a cross-sectional view showing the manufacturing method of forming the protective film, the electrodes and the metal film on the semiconductor element according to the first embodiment of the present invention.
Figure 7A:
FIG. 7A is a cross-sectional view showing a manufacturing method of forming the protective film, electrodes and a metal film on the semiconductor element according to the first embodiment of the present invention.
Figure 7B:
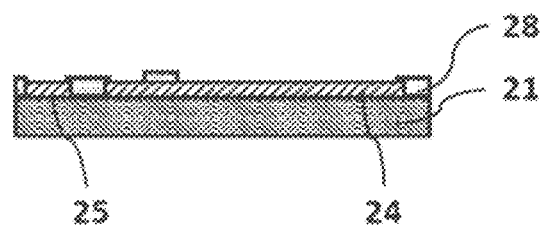
FIG. 7B is a cross-sectional view showing the manufacturing method of forming the protective film, the electrodes and the metal film on the semiconductor element according to the first embodiment of the present invention.
Figure 7C:
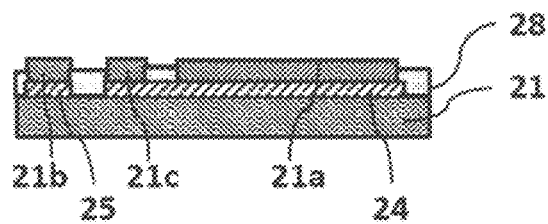
FIG. 7C is a cross-sectional view showing the manufacturing method of forming the protective film, the electrodes and the metal film on the semiconductor element according to the first embodiment of the present invention.

FIGS. 6A to 6C show forming main electrode 21a, control electrode 21b, and metal film 21c on the front surface of semiconductor element 21, and FIGS. 7A to 7C show forming third electrode 24, fourth electrode 25 on the front surface of semiconductor element 21, forming main electrode 21a and metal film 21c on third electrode 24, and forming control electrode 21b on fourth electrode 25. The broken lines in FIG. 5 indicate the outer peripheries of third electrode 24 and fourth electrode 25.

First, as shown in FIG. 6A, semiconductor element 21 is prepared. Then, as shown in FIG. 6B, in a protective film forming step of forming a protective film, protective film 28 with openings is formed on semiconductor element 21. For example, a polyimide film can be used as protective film 28. That is, on semiconductor element 21, protective film 28 with openings at positions corresponding to the positions where main electrode 21a, control electrode 21b and metal film 21c are to be formed is formed. As shown in FIG. 7A, semiconductor element 21 provided with third electrode 24 and fourth electrode 25 on its surface is prepared. Then, as shown in FIG. 7B, protective film 28 with openings may be formed on semiconductor element 21 provided with third electrode 24 and fourth electrode 25. That is, on semiconductor element 21 provided with third electrode 24 and fourth electrode 25, protective film 28 with openings at positions corresponding to the positions where main electrode 21a, control electrode 21b and metal film 21c are to be formed is formed.

The openings are formed, for example, by applying resin such as polyimide, which is an example material for protective film 28, to semiconductor element 21, or to semiconductor element 21 provided with third electrode 24 and fourth electrode 25, and performing an exposure and development process.

Next, as shown in FIGS. 6C and 7C, in a metal film forming step, a film of nickel as a metal capable of forming an alloy with the solder is formed by plating in the openings corresponding to main electrode 21a, control electrode 21b and metal film 21c with protective film 28 as a mask, to form main electrode 21a, control electrode 21b and metal film 21c. The nickel of main electrode 21a, control electrode 21b and metal film 21c has a thickness of 5.0 μm, for example. In this step, since protective film 28 formed on the front surface of semiconductor element 21 serves as a mask, main electrode 21a, control electrode 21b and metal film 21c can be simultaneously formed by the nickel film by plating in the openings corresponding to main electrode 21a, control electrode 21b and metal film 21c. Alternatively, electrode 21a, control electrode 21b and metal film 21c may be individually formed with protective film 28 as a mask.

In FIG. 6C, when forming the nickel film which will be main electrode 21a, control electrode 21b and metal film 21c by plating, aluminum may be formed in the openings corresponding to main electrode 21a, control electrode 21b, temperature sensing electrode 22b, and metal film 21c, before the nickel plating. In FIG. 7C, when forming the nickel film by plating, third electrode 24 and fourth electrode 25 may include aluminum.

The metal film forming method is not limited to plating, and may be sputtering, electron beam evaporation, and the like. In any case, protective film 28 serves as a mask, and a metal film is formed in the openings in protective film 28.

Although protective film 28 is a polyimide film in this example, protective film 28 may be any organic film that functions as a mask during the metal film formation, such as epoxy resin. Protective film 28 does not need to remain, and may be removed.

Control electrode 21b and temperature sensing electrode 22b do not need to include a metal capable of forming an alloy with the solder, such as nickel, since they are electrically connected to second lead frames 61, 62 that are terminal plates through wires 71, 72, and are not joined with solder. In other words, main electrodes 21a, 22a and metal film 21c can be formed, and control electrode 21b and temperature sensing electrode 22b can be separately formed. Formation of control electrode 21b and temperature sensing electrode 22b, however, requires formation of an additional protective film, resulting in a complicated process. However, control electrode 21b and temperature sensing electrode 22b may include the same type of metal as main electrode 21a and metal film 21c, that is, control electrode 21b and temperature sensing electrode 22b may include a metal capable of forming an alloy with the solder. Control electrode 21b and temperature sensing electrode 22b can thus be formed simultaneously with the formation of main electrode 21a and metal film 21c, so that the manufacturing process can be simplified.

On the other hand, since control electrode 21b and temperature sensing electrode 22b are formed of a film of metal capable of forming an alloy with the solder, solder balls generated from solder 41 may reach control electrode 21b or temperature sensing electrode 22b and be alloyed, that is, may adhere to control electrode 21b or temperature sensing electrode 22b. By forming metal film 21c, however, the solder balls that may be generated from solder 41 can be alloyed with metal film 21c before reaching control electrode 21b or temperature sensing electrode 22b. As a result, the solder balls can be prevented from reaching control electrode 21b or temperature sensing electrode 22b to be wired.

As shown in FIG. 5, the main electrode is formed as main electrode 21a and main electrode 22a in two separate regions. When there is one region to be joined to solder 41, if first lead frame 51 is angled when arranged to face semiconductor element 21, a joint point to solder 41 may be displaced from the center of a region to be joined to solder 41, resulting in uneven current. By dividing the region to be joined to first lead frame 51 through solder 41 into main electrode 21a and main electrode 22a as two regions, the occurrence of the aforementioned problem can be prevented. That is, even when first lead frame 51 is arranged at an angle, the current can be prevented from becoming uneven since the joint point to solder 41 is divided into two regions.

When the main electrode is formed in two separate regions, the thickness of solder 41 can also be readily controlled. When solder 41 has a small height (small thickness) (for example, a thickness of approximately 100 μm after the joining), first lead frame 51 having a high coefficient of linear expansion and semiconductor element 21 having a low coefficient of linear expansion move closer to each other, which may result in high thermal stress on solder 41. Reliability of the joint portion with solder 41 may thus be reduced, and it is important to control the height of solder 41.

A method of manufacturing the semiconductor device having the semiconductor element provided with the above-described electrodes and the like will now be described.

FIGS. 8A to 8D are cross-sectional views showing the method of manufacturing the semiconductor device according to the first embodiment of the present invention. Third electrode 24 and fourth electrode 25 are provided in this example. The protective film is not shown for simplicity.

Figure 8A:
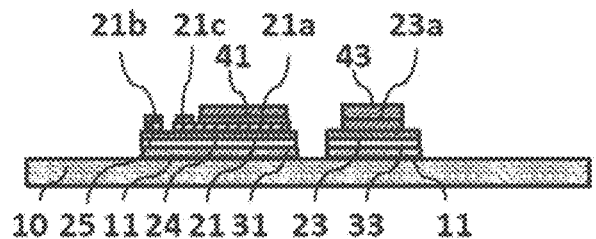
FIG. 8A is a cross-sectional view showing a method of manufacturing the semiconductor device according to the first embodiment of the present invention.

As shown in FIG. 8A, the back electrode (not shown) of semiconductor element 21 provided with the front electrode and the like is joined to conductor layer 11 on insulating substrate 10 with solder 31 as a bonding material. Similarly, the back electrode (not shown) of semiconductor element 23 provided with the front electrode is joined to conductor layer 11 on insulating substrate 10 with solder 33 as a bonding material.

Figure 8B:
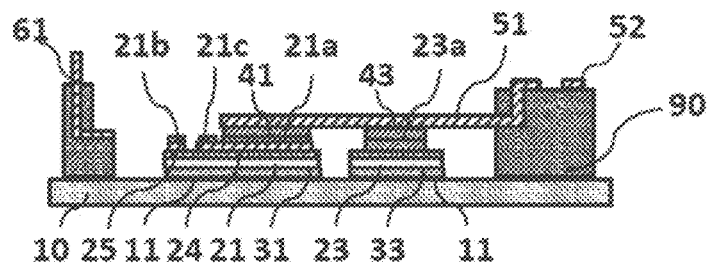
FIG. 8B is a cross-sectional view showing the method of manufacturing the semiconductor device according to the first embodiment of the present invention.

Next, as shown in FIG. 8B, insulating substrate 10 having semiconductor elements 21, 23 joined thereto is arranged at the bottom of frame-shaped case 90, and case 90 is bonded and fixed on insulating substrate 10 with a silicone adhesive material (not shown).

Case 90 is provided with first lead frame 51 and second lead frame 61 by insert molding beforehand. At the top of case 90, main terminal 52 provided at an end of first lead frame 51 is fixed. Although not shown, case 90 is also provided with second lead frame 62. Case 90 is also provided with terminal plate 53 beforehand, and main terminal 54 provided at terminal plate 53 is fixed at the top of case 90.

When case 90 is arranged at a predetermined position of insulating substrate 10, first lead frame 51 is fixed to case 90 such that the solder joint portions to main electrodes 21a, 23a are at the positions opposed to main electrodes 21a, 23a of semiconductor elements 21, 23 joined to insulating substrate 10. Second lead frame 61 is fixed to case 90 such that the wire bonding portion is at the position corresponding to control electrode 21b of semiconductor element 21 joined to insulating substrate 10.

Next, in a solder-joining step, plate solder 41 is arranged on main electrode 21a of semiconductor element 21 joined to insulating substrate 10. Although not shown, plate solder 41 is also arranged on main electrode 22a. Plate solder 43 is arranged on main electrode 23a of semiconductor element 23 joined to insulating substrate 10. Plate solder 41 and first lead frame 51 are arranged on main electrode 21a of semiconductor element 21, and plate solder 43 and first lead frame 51 are arranged on main electrode 23a of semiconductor element 23 in this manner, and plate solders 41, 43 are heated by a reflow furnace or a hot plate to be melted. Main electrodes 21a, 23a are thus joined to first lead frame 51 with solder.

When using solders 31, 33 as a bonding material, it is preferable to select a material such that the melting point of solders 41 and 43 is lower than the melting point of solders 31 and 33. Consequently, when joining semiconductor elements 21, 23 to first lead frame 51 with solder, solders 31, 33 do not remelt even when semiconductor elements 21, 23 have already been joined to conductor layer 11 with solders 31, 33.

Figure 8C:
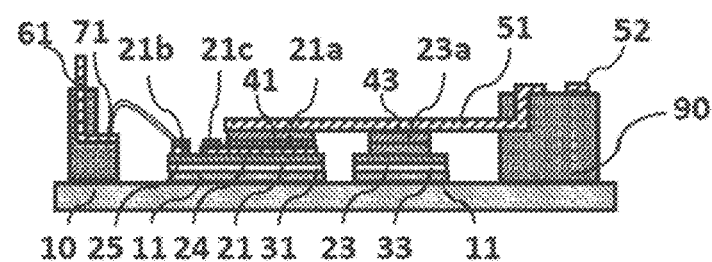
FIG. 8C is a cross-sectional view showing the method of manufacturing the semiconductor device according to the first embodiment of the present invention.

Next, in a wiring step, as shown in FIG. 8C, a wire is joined onto control electrode 21b of semiconductor element 21 and onto second lead frame 61 by wire bonding through ultrasonic welding. That is, wire 71 is used to electrically connect control electrode 21b of semiconductor element 21 to second lead frame 61. Although not shown, wire 72 is used to electrically connect temperature sensing electrode 22b of semiconductor element 21 to second lead frame 62.

Although not shown, terminal plate 53 is joined to conductor layer 11 provided on insulating substrate 10 by ultrasonic welding. This joining by ultrasonic welding may be performed before or after the solder-joining of main electrodes 21a, 23a that are the front electrodes of semiconductor elements 21, 23 to first lead frame 51. Semiconductor elements 21, 23 are electrically connected between main terminal 52 and main terminal 54 of the semiconductor device by the solder-joining and ultrasonic welding described above.

Figure 8D:
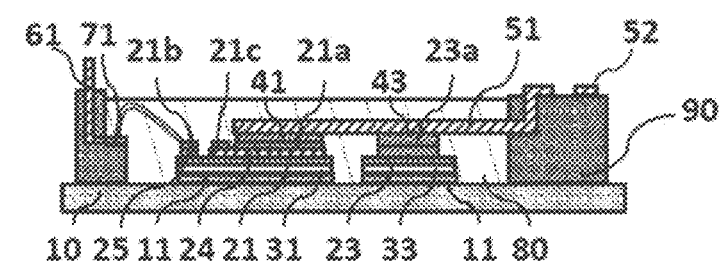
FIG. 8D is a cross-sectional view showing the method of manufacturing the semiconductor device according to the first embodiment of the present invention.

Next, as shown in FIG. 8D, sealing resin portion 80 is formed with potting resin in case 90 to seal case 90 in an insulated manner, whereby the semiconductor device is completed.

Figure 8E:
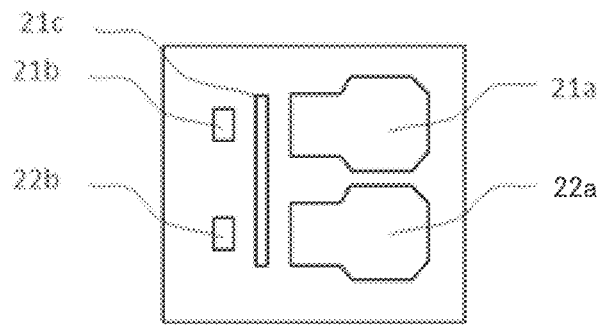
FIG. 8E is an enlarged plan view showing a method of manufacturing another variation of the semiconductor device according to the first embodiment of the present invention.
Figure 8F:
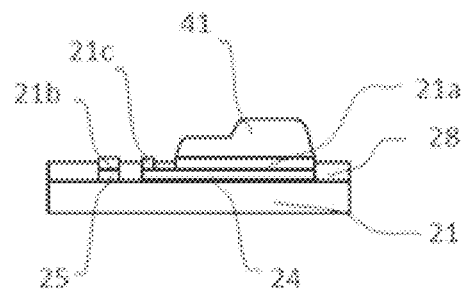
FIG. 8F is a cross-sectional view showing the method of manufacturing the another variation of the semiconductor device according to the first embodiment of the present invention.
Figure 8G:
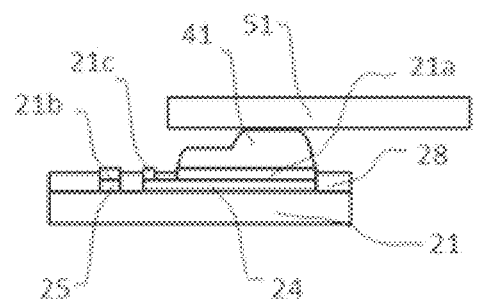
FIG. 8G is a cross-sectional view showing the method of manufacturing the another variation of the semiconductor device according to the first embodiment of the present invention.
Figure 8H:
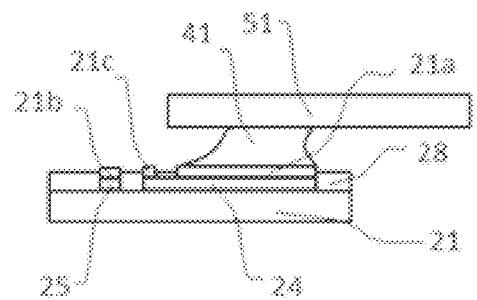
FIG. 8H is a cross-sectional view showing the method of manufacturing the another variation of the semiconductor device according to the first embodiment of the present invention.

FIG. 8E is an enlarged plan view showing a method of manufacturing another variation of the semiconductor device according to the first embodiment of the present invention. FIGS. 8F to 8H are cross-sectional views showing the method of manufacturing the another variation of the semiconductor device according to the first embodiment of the present invention. Semiconductor element 21 is mainly shown in FIGS. 8E to 8H. The method of manufacturing the semiconductor device shown in FIGS. 8E to 8H is basically similar to the method of manufacturing the semiconductor device shown in FIGS. 8A to 8D, but differs in the configuration of semiconductor element 21.

That is, as shown in FIG. 8E, main electrodes 21a, 22a have a smaller width in their regions closer to control electrode 21b, temperature sensing electrode 22b, and have a greater width in their opposite regions. From a different viewpoint, main electrodes 21a, 22a as the first electrodes are smaller in width at their ends closer to control electrode 21b and temperature sensing electrode 22b as the second electrodes than at their ends further from control electrode 21b and temperature sensing electrode 22b.

By forming main electrodes 21a, 22a in this manner, the height of solder 41 supplied to main electrodes 21a, 22a can be locally changed as shown in FIG. 8F. Specifically, solder 41 is formed such that the height of solder 41 in a region relatively closer to control electrode 21b, temperature sensing electrode 22b is lower than the height of solder 41 in a region relatively further from control electrode 21b, temperature sensing electrode 22b.

Consequently, as shown in FIG. 8G, when first lead frame 51 is mounted on solder 41, solder 41 located in the region further from control electrode 21b, temperature sensing electrode 22b comes into contact with first lead frame 51. As a result, as shown in FIG. 8H, solder 41 melts, wets and spreads mainly on the side further from control electrode 21b, temperature sensing electrode 22b. Solder scattering to control electrode 21b, temperature sensing electrode 22b is thus less likely occur.

As described above, according to the first embodiment, on semiconductor element 21, between main electrodes 21a, 22a joined to first lead frame 51 with solder 41, and control electrode 21b or temperature sensing electrode 22b to be wired including a metal capable of forming an alloy with the solder, there is provided metal film 21c spaced from each of main electrodes 21a, 22a and control electrode 21b, temperature sensing electrode 22b, and including a metal capable of forming an alloy with the solder.

From a different viewpoint, the semiconductor device according to the first embodiment includes: insulating substrate 10 as a substrate; semiconductor element 21; first lead frame 51 as a plate-like member; main electrodes 21a, 22a as the first electrodes; control electrode 21b and temperature sensing electrode 22b as the second electrodes; and metal film 21c. Semiconductor element 21 is arranged on insulating substrate 10. First lead frame 51 is electrically connected to semiconductor element 21. Main electrodes 21a, 22a are formed on semiconductor element 21. Main electrodes 21a, 22a are joined to first lead frame 51 with solder 41. Control electrode 21b and temperature sensing electrode 22b are formed on semiconductor element 21 and spaced from main electrodes 21a, 22a. Control electrode 21b and temperature sensing electrode 22b include a metal capable of forming an alloy with solder 41. Metal film 21c is formed on semiconductor element 21 and spaced from control electrode 21b and temperature sensing electrode 22b in a region on the main electrodes 21a, 22a side as seen from control electrode 21b and temperature sensing electrode 22b, in a two-dimensional view of semiconductor element 21 as seen from first lead frame 51. Metal film 21c includes a metal capable of forming an alloy with solder 41.

In the step of solder-joining first lead frame 51 to main electrodes 21a, 22a, solder 41 takes in air while it melts. When the introduced air comes out, solder balls may be generated and move over semiconductor element 21.

When the solder balls move over semiconductor element 21 and reach control electrode 21b or temperature sensing electrode 22b, they are alloyed. It is difficult to remove the alloyed solder balls after the solder-joining step. Ultrasonic welding of a wire to control electrode 21b or temperature sensing electrode 22b by wire bonding with alloying and adherence of the solder balls may result in breakage of semiconductor element 21, or may reduce reliability of the joining because the joint area of wire bonding is reduced.

By providing metal film 21c having a metal capable of forming an alloy with the solder between main electrodes 21a, 22a and control electrode 21b or temperature sensing electrode 22b, the solder balls generated from solder 41 can be alloyed with metal film 21c during the solder-joining of first lead frame 51 to main electrodes 21a, 22a. As a result, the solder balls can be prevented from reaching control electrode 21b or temperature sensing electrode 22b to be wired. In other words, the solder balls can be prevented from adhering to metal film 21c, and the solder balls can be prevented from reaching control electrode 21b or temperature sensing electrode 22b, so that the breakage of the semiconductor element can be prevented. In addition, the reduced reliability of the joining caused by the reduced joint area of wire bonding due to the adherence of the solder balls to control electrode 21b or temperature sensing electrode 22b can be prevented.

When protective film 28 is formed on the front surface of semiconductor element 21, main electrode 21a and metal film 21c are formed on semiconductor element 21 and spaced from each other, and protective film 28 is formed between main electrode 21a and metal film 21c. A film made of a material with lower solder wettability than metal film 21c is preferably formed as protective film 28. For example, a polyimide film as an organic film may be formed as the protective film. Protective film 28, metal film 21c, and protective film 28 are present from the main electrode 21a side. The presence of protective film 28 as described above can prevent the solder on main electrode 21a from spreading to metal film 21c, to more reliably prevent the solder balls from reaching control electrode 21b.

Further, assume that a polyimide film with openings is formed as protective film 28 on semiconductor element 21. In this case, metal film 21c having a metal capable of forming an alloy with the solder and sealing resin portion 80 are in more intimate contact than between protective film 28 formed of a polyimide film and sealing resin portion 80. By providing metal film 21c, therefore, separation between semiconductor element 21 and sealing resin portion 80 is less likely to occur, so that reliability can be improved.

When a polyimide film with openings is formed as protective film 28 on semiconductor element 21, in the metal film forming step, a film of metal capable of forming an alloy with the solder is formed in the openings corresponding to main electrode 21a, control electrode 21b and metal film 21c with protective film 28 as a mask, to form main electrode 21a, control electrode 21b and metal film 21c. The use of protective film 28 as a mask simplifies the process. Further, in the metal film forming step, a nickel film can be simultaneously formed by plating in the openings corresponding to main electrode 21a, control electrode 21b and metal film 21c with protective film 28 as a mask.

The distance between metal film 21c and main electrode 21a can be smaller than the distance between metal film 21c and control electrode 21b. By securing a longer distance between metal film 21c and control electrode 21b, even when the solder balls adhere to metal film 21c on the control electrode 21b side, the solder can be more reliably prevented from reaching control electrode 21b because of the large spacing between metal film 21c and control electrode 21b.

The height of metal film 21c may be higher than the height of main electrodes 21a, 22a on which solder 41 is applied, with reference to the front surface of semiconductor element 21. Similarly, the height of metal film 21c may be higher than the height of control electrode 21b or temperature sensing electrode 22b as the second electrode to be wired. This configuration can prevent the solder balls from jumping over metal film 21c and reaching control electrode 21b or temperature sensing electrode 22b. When the height of metal film 21c is increased, provided that the height of metal film 21c is the same, a smaller distance between metal film 21c and main electrode 21a is more preferable as it provides the effect of preventing the solder balls jumping upward at a larger angle from reaching control electrode 21b and temperature sensing electrode 22b.

As shown in FIG. 3C or 3D, when the shortest distance between main electrode 21a and metal film 21c in the x axis direction or the shortest distance between control electrode 21b and metal film 21c in the x axis direction varies in they axis direction in which main electrodes 21a, 22a are aligned, metal film 21c is preferably formed closer to main electrode 21a than to control electrode 21b at a location close to control electrode 21b. Consequently, even when the solder balls adhere to metal film 21c on the control electrode 21b side, the solder balls can be more reliably prevented from adhering to control electrode 21b because of the large spacing between metal film 21c and control electrode 21b. In other words, even when the solder balls adhere to metal film 21c on the control electrode 21b side, the possibility of the solder adhering to control electrode 21b can be reduced.

With the characteristic structure of metal film 21c as shown in FIG. 3C or 3D, metal film 21c can be used as a recognition mark by which to correct misalignment and rotation of semiconductor element 21 during wire bonding, so that positional accuracy in the wiring step can be improved.

With the configuration in which control electrode 21b is sandwiched between first metal film 26c and second metal film 27c, or the configuration in which metal film 21c surrounds control electrode 21b, as shown in FIGS. 3E to 3G, solder balls that may be generated from solder 41 can be prevented from adhering to control electrode 21b, and solder balls that may be generated from solder 31, that is, solder balls from under semiconductor element 21, can be prevented from adhering to control electrode 21b.

Second Embodiment

Figure 9:
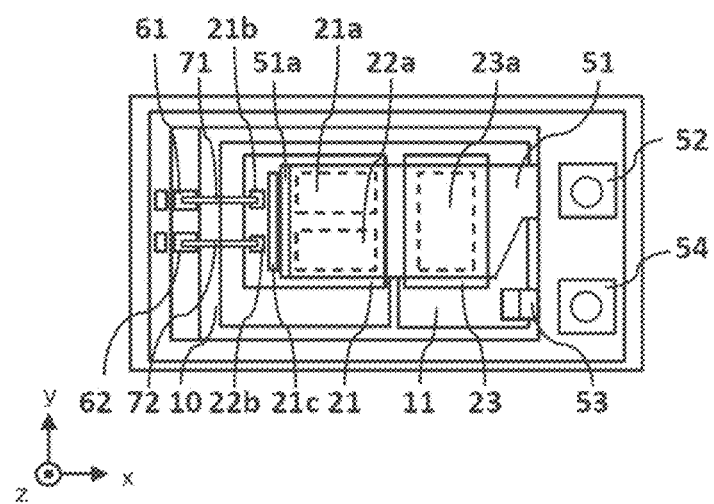
FIG. 9 is a plan view showing a semiconductor device according to a second embodiment of the present invention.
Figure 10A:
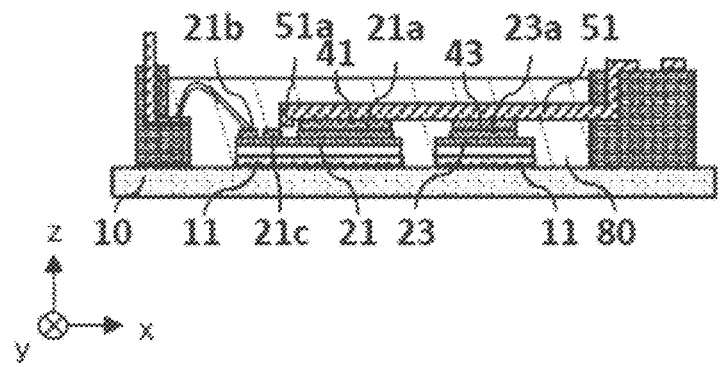
FIG. 10A is a cross-sectional view showing the semiconductor device according to the second embodiment of the present invention.
Figure 10B:
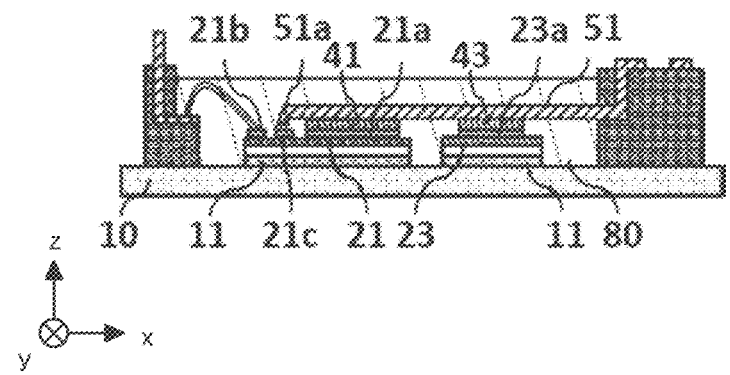
FIG. 10B is a cross-sectional view showing a variation of the semiconductor device according to the second embodiment of the present invention.
Figure 10C:
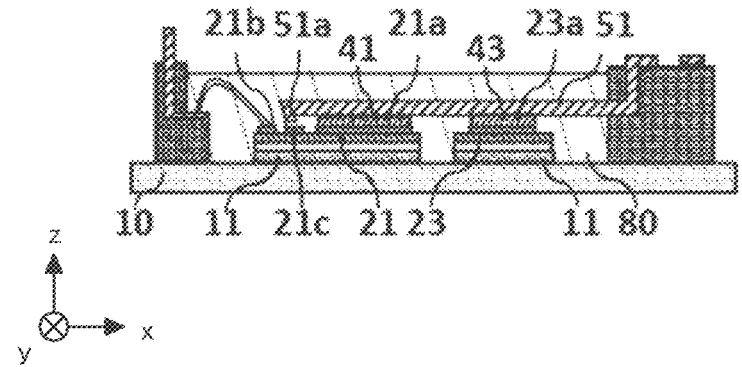
FIG. 10C is a cross-sectional view showing a variation of the semiconductor device according to the second embodiment of the present invention.

The configuration of a semiconductor device according to a second embodiment of the present invention is described. FIG. 9 is a plan view showing the semiconductor device according to the second embodiment of the present invention. FIGS. 10A to 10C are cross-sectional views showing the semiconductor device according to the second embodiment of the present invention. In the figures, x, y and z orthogonal coordinate axes are also shown for illustrating directions.

The second embodiment differs from the first embodiment in the configuration of a tip end of first lead frame 51. Third electrode 24 and fourth electrode 25 are not formed in the second embodiment. As shown in FIG. 10A, a protrusion 51a protruding in the direction of insulating substrate 10 is provided at the tip end of first lead frame 51. Protrusion 51a is formed by being bent in the z axis direction, that is, in the vertical direction, relative to first lead frame 51.

Protrusion 51a may be bent at an angle from the vertical direction relative to first lead frame 51, that is, may be inclined relative to first lead frame 51, as shown in FIGS. 10B and 10C. Specifically, as shown in FIG. 10B, protrusion 51a may be inclined relative to the direction in which first lead frame 51 extends such that protrusion 51a moves closer to control electrode 21b toward semiconductor element 21. As shown in FIG. 10C, protrusion 51a may be inclined relative to the direction in which first lead frame 51 extends such that protrusion 51a moves away from control electrode 21b toward semiconductor element 21.

As shown in FIG. 9, protrusion 51a is located between main electrode 21a and metal film 21c, as seen in a direction perpendicular to the surface of insulating substrate 10 on which semiconductor element 21 is mounted. In other words, protrusion Ma is located between main electrode 21a and metal film 21c in a two-dimensional view of semiconductor element 21 from above, that is, in a two-dimensional view of semiconductor element 21 as seen from first lead frame 51. Similarly, protrusion Ma is located between main electrode 22a and metal film 21c. FIG. 10A is a cross-sectional view corresponding to FIG. 9, and protrusion Ma is located in a space between main electrode 21a and metal film 21c.

Protrusion Ma may be located between main electrode 21a and control electrode 21b, as seen in the direction perpendicular to the surface of insulating substrate 10 on which semiconductor element 21 is mounted. In this case, it is more preferable for protrusion 51a to at least partially overlap metal film 21c in the two-dimensional view of semiconductor element 21 as seen from first lead frame 51, for causing the solder balls to adhere to metal film 21c.

When protrusion Ma is located between main electrode 21a and metal film 21c, the spacing between the front surface of semiconductor element 21 and protrusion Ma is preferably less than or equal to 0.1 mm. When a protective film is formed, the spacing between the protective film and protrusion Ma is preferably less than or equal to 0.1 mm. The front surface of semiconductor element 21 or the protective film may be in contact with protrusion 51a.

As seen in the direction perpendicular to the surface of insulating substrate 10 on which semiconductor element 21 is mounted, when protrusion Ma at least partially overlaps metal film 21c, the spacing between metal film 21c and protrusion 51a is preferably less than or equal to 0.1 mm. Metal film 21c may be in contact with protrusion 51a.

Protrusion Ma is formed by bending a tip end portion of first lead frame 51. Protrusion 51a can be formed by half die cutting, instead of by bending.

Alternatively, protrusion Ma can be formed by joining or bonding a metal member, which is an example member different from first lead frame 51, to the tip end portion of first lead frame 51. Protrusion Ma can also be formed by bonding a resin member, which is an example of the member described above, to the tip end portion of first lead frame 51.

As described above, according to the second embodiment, protrusion Ma protruding toward semiconductor element 21 is provided at the tip end of first lead frame 51.

In the step of solder-joining first lead frame 51 to main electrodes 21a, 22a, solder balls may be generated from solder 41 while solder 41 melts. In this case, the solder balls may possibly be released at such an angle that they jump over metal film 21c. Even when the solder balls are scattered at such an angle that they jump over metal film 21c and adhere to control electrode 21b, protrusion Ma can cause the solder balls to adhere to protrusion Ma, or cause the solder balls to fall to the front surface of semiconductor element 21. When the solder balls fall to the front surface of semiconductor element 21 by protrusion Ma, they should solidify at the locations where they fell. The solder balls, however, may stay melted, roll over the front surface of semiconductor element 21 to reach control electrode 21b and temperature sensing electrode 22b, and form an alloy. Even in this case, the presence of metal film 21c formed between main electrodes 21a, 22a and control electrode 21b, temperature sensing electrode 22b can prevent the solder balls from adhering to control electrode 21b and temperature sensing electrode 22b.

In the configuration in which the tip end of first lead frame 51 has protrusion Ma, the intimate contact between sealing resin portion 80 and first lead frame 51 can be improved by an anchoring effect of protrusion 51a, so that a module with excellent reliability can be provided.

When protrusion 51a is in contact with metal film 21c, the distance between first lead frame 51 and semiconductor element 21 and the distance between first lead frame 51 and insulating substrate 10 can be adjusted by the height of protrusion Ma, so that the thickness of the solder on main electrode 21a can be readily adjusted.

In the configuration shown in FIG. 9 and FIGS. 10A to 10C described above, metal film 21c may be connected to at least one of main electrode 21a and main electrode 22a through exposed portion 21f as a connecting portion, as shown in FIG. 3J or 3K.

Third Embodiment

The present embodiment is an application of the semiconductor device according to the first or second embodiment described above to a power conversion device. Although the present disclosure is not limited to a specific power conversion device, an application of the present disclosure to a three-phase inverter will now be described as the third embodiment.

Figure 11:
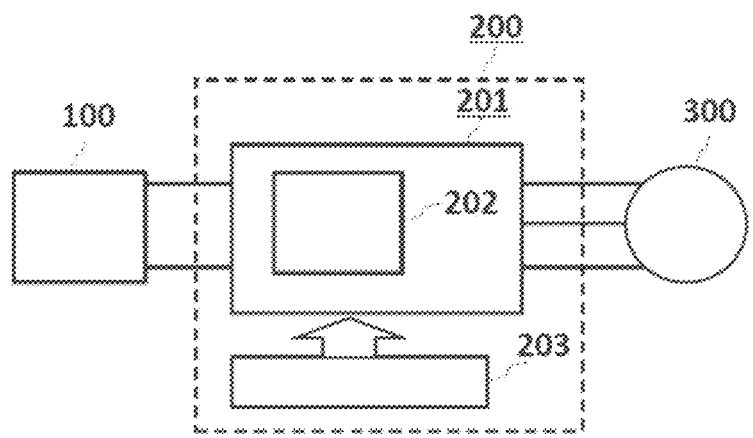
FIG. 11 is a block diagram showing the configuration of a power conversion system to which a power conversion device according to a third embodiment of the present invention is applied.

FIG. 11 is a block diagram showing the configuration of a power conversion system to which the power conversion device according to the present embodiment is applied.

The power conversion system shown in FIG. 11 is configured with a power supply 100, a power conversion device 200, and a load 300. Power supply 100 is a DC power supply, and supplies DC power to power conversion device 200. Power supply 100 can be configured with various components such as a DC system, a solar cell, and a power storage battery, or can be configured with a rectifier circuit or AC/DC converter connected to an AC system. Alternatively, power supply 100 may be configured with a DC/DC converter that converts DC power output from a DC system into predetermined power.

Power conversion device 200 is a three-phase inverter connected between power supply 100 and load 300, converts the DC power supplied from power supply 100 into AC power, and supplies the AC power to load 300. Power conversion device 200 includes, as shown in FIG. 11, a main conversion circuit 201 that converts DC power into AC power and outputs the converted AC power, and a control circuit 203 that outputs a control signal for controlling main conversion circuit 201 to main conversion circuit 201.

Load 300 is a three-phase motor to be driven using the AC power supplied from power conversion device 200. Load 300 is not limited to a specific application and is a motor mountable on various types of electric apparatuses. For example, load 300 is used as a motor for hybrid vehicles, electric vehicles, railroad vehicles, elevators, or air conditioners.

Details of power conversion device 200 will now be described. Main conversion circuit 201 includes a switching element and a reflux diode (not shown). By switching of the switching element, DC power supplied from power supply 100 is converted into AC power and is supplied to load 300. Although there are various types of specific circuit configurations for main conversion circuit 201, main conversion circuit 201 according to the present embodiment is a two-level three-phase full bridge circuit, and can be constituted of six switching elements and six reflux diodes respectively connected to the switching elements in anti-parallel. Each switching element and each reflux diode of main conversion circuit 201 is configured with semiconductor device 202 corresponding to the first or second embodiment described above. Every two of the six switching elements are connected in series to form an upper-lower arm. The upper-lower arms constitute respective phases (U phase, V phase, and W phase) of the full bridge circuit. Output terminals of the upper-lower arms, i.e., three output terminals of main conversion circuit 201, are connected to load 300.

Main conversion circuit 201 includes a drive circuit (not shown) that drives each switching element. The drive circuit may be included in semiconductor device 202, or may be provided separately from semiconductor device 202. The drive circuit generates a driving signal for driving the switching element of main conversion circuit 201, and supplies it to a control electrode of the switching element of main conversion circuit 201. Specifically, in accordance with a control signal from control circuit 203 which will be described later, the drive circuit outputs, to a control electrode of each switching element, a driving signal for bringing the switching element into an ON state and a driving signal for bringing the switching element into an OFF state. When the switching element is to be maintained in the ON state, the driving signal is a voltage signal (ON signal) higher than or equal to the threshold voltage of the switching element. When the switching element is to be maintained in the OFF state, the driving signal is a voltage signal (OFF signal) lower than or equal to the threshold voltage of the switching element.

Control circuit 203 controls a switching element of main conversion circuit 201 to supply desired power to load 300. Specifically, based on power to be supplied to load 300, a time (ON time) at which each switching element of main conversion circuit 201 is to be brought into the ON state is calculated. For example, main conversion circuit 201 can be controlled through PWM (Pulse Width Modulation) control to modulate the ON time of the switching element in accordance with a voltage to be output. Control circuit 203 outputs a control command (control signal) to a drive circuit included in main conversion circuit 201 so as to output an ON signal to a switching element to be brought into the ON state and an OFF signal to a switching element to be brought into the OFF state at respective points of time. In accordance with each of the control signals, the drive circuit outputs the ON signal or the OFF signal to the control electrode of a corresponding switching element as the driving signal.

Since the semiconductor device according to the first or second embodiment is applied as the switching element and the reflux diode of main conversion circuit 201 in the power conversion device according to the present embodiment, reliability can be improved.

Although the application of the present disclosure to the two-level three-phase inverter has been described in the present embodiment, the present disclosure is not limited to this, and is applicable to various types of power conversion devices. Although the two-level power conversion device is employed in the present embodiment, a three-level or multi-level power conversion device may be employed, or the present disclosure may be applied to a single-phase inverter when power is supplied to a single-phase load. Moreover, when power is supplied to a DC load or the like, the present disclosure can be applied to a DC/DC converter or an AC/DC converter.

Moreover, the power conversion device to which the present disclosure is applied is not limited to the case where the load is a motor, but can be used as a power supply device for an electrical discharge machining apparatus, a laser machining apparatus, an induction heating cooking device, or an non-contact power feeding system, and can be also used as a power conditioner in a photovoltaic power system, a power storage system, or the like, for example.

It should be understood that the embodiments disclosed herein are illustrative and non-restrictive in every respect. At least two of the embodiments disclosed herein can be combined within the range where inconsistency does not occur. The scope of the present invention is defined by the terms of the claims, rather than the description above, and is intended to include any modifications within the meaning and scope equivalent to the terms of the claims.

REFERENCE SIGNS LIST

10 insulating substrate (substrate); 11 conductor layer; 21, 23 semiconductor element; 21*a* main electrode (first electrode); 21*a*1, 21*a*2 corner; 21*b* control electrode (second electrode); 21*b*1, 21*b*2 corner; 21*c*, 22*c* metal film; 21*c*1 first end portion; 21*c*2 second end portion; 21*e*1, 21*e*2, 21*e*3, 21*e*4 outer peripheral portion; 22*b* temperature sensing electrode (second electrode); 23*a* main electrode; 24 third electrode; 25 fourth electrode; 26*c* first metal film; 27*c* second metal film; 28 protective film; 31, 33 solder (bonding material); 41, 43 solder; 51 first lead frame (plate-like member); 51*a* protrusion; 52, 54 main terminal; 53 terminal plate; 61, 62 second lead frame; 71, 72 wire; 80 sealing resin portion; 90 case; 100 power supply; 200 power conversion device; 201 main conversion circuit; 202 semiconductor device; 203 control circuit; 300 load.

The invention claimed is:

1. A semiconductor device comprising:
a substrate;
a semiconductor element arranged on the substrate;
a plate-like member electrically connected to the semiconductor element;
a first electrode formed on the semiconductor element and joined to the plate-like member with solder;
a second electrode formed on the semiconductor element and spaced from the first electrode, and including a metal capable of forming an alloy with the solder; and
a metal film formed on the semiconductor element and spaced from the second electrode in a region on the first electrode side as seen from the second electrode, in a two-dimensional view of the semiconductor element as seen from the plate-like member, and including a metal capable of forming an alloy with the solder,
wherein the second electrode is electrically isolated from the plate-like member and the first electrode.

2. The semiconductor device according to claim 1, wherein
the metal film includes at least one of Ni, Au, Ag, Cu.

3. The semiconductor device according to claim 1, wherein
the first electrode, the second electrode and the metal film include a same type of metal.

4. The semiconductor device according to claim 1, further comprising a third electrode on a surface of the semiconductor element, wherein
the first electrode and the metal film are formed on the third electrode.

5. The semiconductor device according to claim 1, further comprising a protective film having openings on the semiconductor element, wherein
the first electrode, the second electrode and the metal film are formed in the openings.

6. The semiconductor device according to claim 1, wherein
the metal film has a first metal film formed between the first electrode and the second electrode, and a second metal film formed opposite the first metal film with respect to the second electrode.

7. The semiconductor device according to claim 1, wherein
the metal film has a first end portion and a second end portion extending toward the second electrode at its opposite ends, and
the second electrode is sandwiched between the first end portion and the second end portion.

8. The semiconductor device according to claim 1, wherein
the metal film surrounds the second electrode.

9. The semiconductor device according to claim 1, wherein the metal film includes a plurality of metal film portions arranged to surround the second electrode.

10. The semiconductor device according to claim 9, wherein
the metal film includes an inner peripheral metal film portion arranged between each of the plurality of metal film portions and the second electrode.

11. The semiconductor device according to claim 1, comprising a connecting portion to connect the metal film to the first electrode, and
a minimum width of the connecting portion is smaller than a minimum width of the first electrode.

12. The semiconductor device according to claim 11, wherein
the minimum width of the connecting portion is smaller than a minimum width of the metal film.

13. The semiconductor device according to claim 1, wherein
a height of the metal film is higher than a height of the first electrode and lower than a height of the plate-like member with reference to the surface of the semiconductor element.

14. The semiconductor device according to claim 1, wherein
the plate-like member has a protrusion protruding in a direction of the substrate at its tip end, and
the protrusion is located between the first electrode and the second electrode, as seen in a direction perpendicular to a surface of the substrate on which the semiconductor element is mounted.

15. The semiconductor device according to claim 1, wherein
the plate-like member has a protrusion protruding in a direction of the substrate at its tip end, and
the protrusion at least partially overlaps the metal film, as seen in a direction perpendicular to a surface of the substrate on which the semiconductor element is mounted.

16. The semiconductor device according to claim 1, wherein
the first electrode is smaller in width at its end closer to the second electrode than at its end further from the second electrode.

17. A power conversion device comprising:
a main conversion circuit having the semiconductor device according to claim 1, to convert input power and output the converted power; and
a control circuit to output a control signal for controlling the main conversion circuit to the main conversion circuit.

18. A method of manufacturing a semiconductor device, the semiconductor device comprising
a substrate,
a semiconductor element arranged on the substrate,
a plate-like member electrically connected to the semiconductor element,
a first electrode formed on the semiconductor element and joined to the plate-like member with solder,
a second electrode formed on the semiconductor element and spaced from the first electrode, and
a metal film formed on the semiconductor element and spaced from the second electrode in a region on the first electrode side as seen from the second electrode, in a two-dimensional view of the semiconductor element as seen from the plate-like member,
the method comprising:
a protective film forming step of forming a protective film on the semiconductor element, the protective film having openings at positions corresponding to positions where the first electrode, the second electrode and the metal film are to be formed;
a metal film forming step of forming a film of metal capable of forming an alloy with the solder in the openings with the protective film as a mask, to form the first electrode, the second electrode and the metal film;
a solder-joining step of arranging the solder and the plate-like member on the first electrode, and heating the solder to join the first electrode to the plate-like member; and
a wiring step of joining a wire onto the second electrode.

* * * * *